United States Patent [19]
Huang

[11] Patent Number: 5,977,835
[45] Date of Patent: Nov. 2, 1999

[54] METHOD AND CIRCUIT ARRANGEMENT FOR REDUCING PASSBAND RIPPLE OF A BANDPASS FILTER

[75] Inventor: Guanghua Huang, Hutchinson, Minn.

[73] Assignee: ADC Telecommunications, Inc., Minnetonka, Mass.

[21] Appl. No.: 09/019,847

[22] Filed: Feb. 6, 1998

[51] Int. Cl.$^6$ ........................................................ H03F 3/04
[52] U.S. Cl. .............................................. 330/305; 330/306
[58] Field of Search ..................................... 330/305, 306, 330/149, 303; 327/557; 333/81 R, 167, 174; 455/86, 87, 307, 77, 76, 183.1, 182.3, 283, 286, 311

[56] References Cited

U.S. PATENT DOCUMENTS

| | | | |
|---|---|---|---|
| 5,511,236 | 4/1996 | Umstattd et al. | 455/76 |
| 5,521,650 | 5/1996 | Ku | 348/731 |
| 5,603,097 | 2/1997 | Kanou | 455/76 |
| 5,657,344 | 8/1997 | Na | 375/219 |
| 5,689,819 | 11/1997 | Nishimura et al. | 455/86 |
| 5,758,266 | 5/1998 | Kornfeld et al. | 455/86 |

*Primary Examiner*—Robert Pascal
*Assistant Examiner*—Henry Choe
*Attorney, Agent, or Firm*—Merchant & Gould P.C.

[57] ABSTRACT

The passband ripple of a filter arrangement, including an amplifier and a bandpass filter, is tuned to a desirable level at the expense of the output return loss of the filter arrangement. Thus, the output return loss is increased as a result of reducing the ripple. To reduce the output return loss to a desired level, a lossy network is coupled to the output of the filter. The output return loss is reduced by twice the insertion loss of the lossy network. The insertion loss of the lossy network can be compensated for by increasing the gain of the amplifier.

25 Claims, 5 Drawing Sheets

METHOD AND CIRCUIT ARRANGEMENT FOR REDUCING PASSBAND RIPPLE OF A BANDPASS FILTER

FIELD OF THE INVENTION

The present invention relates generally to radio wave filtering circuit arrangements, and more particularly to reducing passband ripple in such filter arrangements.

BACKGROUND OF THE INVENTION

Radio frequency (RF) equipment uses a variety of approaches and structures for receiving and transmitting radio waves in selected frequency bands. Typically, filtering structures are used to maintain proper communication and frequency bands assigned to a particular band. The type of filtering structure used often depends upon the intended use and specifications for the radio equipment. For example, dielectric and coaxial cavity resonator filters are often used for filtering electromagnetic energy in certain frequency bands, such as those used for cellular and PCS communications.

The "ripple" of a radio wave filter arrangement is defined as the fluctuation of the frequency response in the passband of the filter of the filter arrangement. Various coded division multi-access (CDMA) cellular telephone applications require the ripple of a filter arrangement to be less than a predetermined level, such as 0.5 dB within a continuous passband of 1.23 MHz or 2 MHz.

A prior approach for reducing the ripple of a filter arrangement uses a filter having a relatively large Q factor. However, this approach requires a large resonator cavity for the filter, along with a sophisticated design and production process. Therefore, while other designs may effectively reduce the ripple of a filter arrangement, they do so with accompanying additional expenses resulting from added design and production costs. A filter arrangement that addresses the above-identified problems would therefore be desirable.

SUMMARY OF THE INVENTION

In a first embodiment of the invention, a method is provided for reducing passband ripple of a circuit arrangement including an amplifier coupled to a bandpass filter and a lossy network coupled to the bandpass filter, the filter having a Q factor that is low relative to an acceptable level of ripple, wherein tuning the filter to reduce the ripple to the acceptable level causes an unacceptable level of output return loss of the filteris provided in an embodiment of the invention. The method comprises the steps of: tuning the bandpass filter to produce a ripple having an acceptable level, thereby causing output return loss of the filter to rise to an unacceptable level; and reducing the output return loss to an acceptable level by providing a lossy network having sufficient insertion loss.

According to another embodiment, the present invention is directed to a circuit arrangement for reducing passband ripple in a bandpass filter arrangement. The circuit comprises: a signal amplifier; a bandpass filter having an input coupled to the amplifier and an output, and configured and arranged with a low Q factor relative to an acceptable level of ripple and an acceptable level of output return loss, wherein tuning the filter to an acceptable level of ripple results in an unacceptable level of output return loss, wherein the filter is tuned to provide an acceptable level of ripple; and a lossy network coupled to the output of the bandpass filter and having an insertion loss sufficient to reduce the output return loss to an acceptable level.

In another embodiment, a circuit arrangement for reducing passband ripple of a filter in a receiver is provided. The circuit comprises: an antenna; a signal amplifier coupled to the antenna; a bandpass filter having an input coupled to the amplifier and an output, and configured and arranged with a low Q factor relative to an acceptable level of ripple and an acceptable level of output return loss, wherein tuning the filter to an acceptable level of ripple results in an unacceptable level of output return loss, wherein the filter is tuned to provide an acceptable level of ripple; a lossy network coupled to the output of the bandpass filter and having an insertion loss sufficient to reduce the output return loss to an acceptable level; a voltage controlled oscillator; a mixer coupled to the lossy network and to the voltage controlled oscillator, and arranged to provide an intermediate frequency; and an intermediate frequency amplifier coupled to the mixer.

The above summary of the present invention is not intended to describe each disclosed embodiment of the present invention. The figures and details in the description that follow provide additional example embodiments and aspects of the present invention.

BRIEF DESCRIPTION OF THE DRAWINGS

Other aspects and advantages of the invention will become apparent upon reading the following detailed description and upon reference to the drawings in which.

Figure 1:
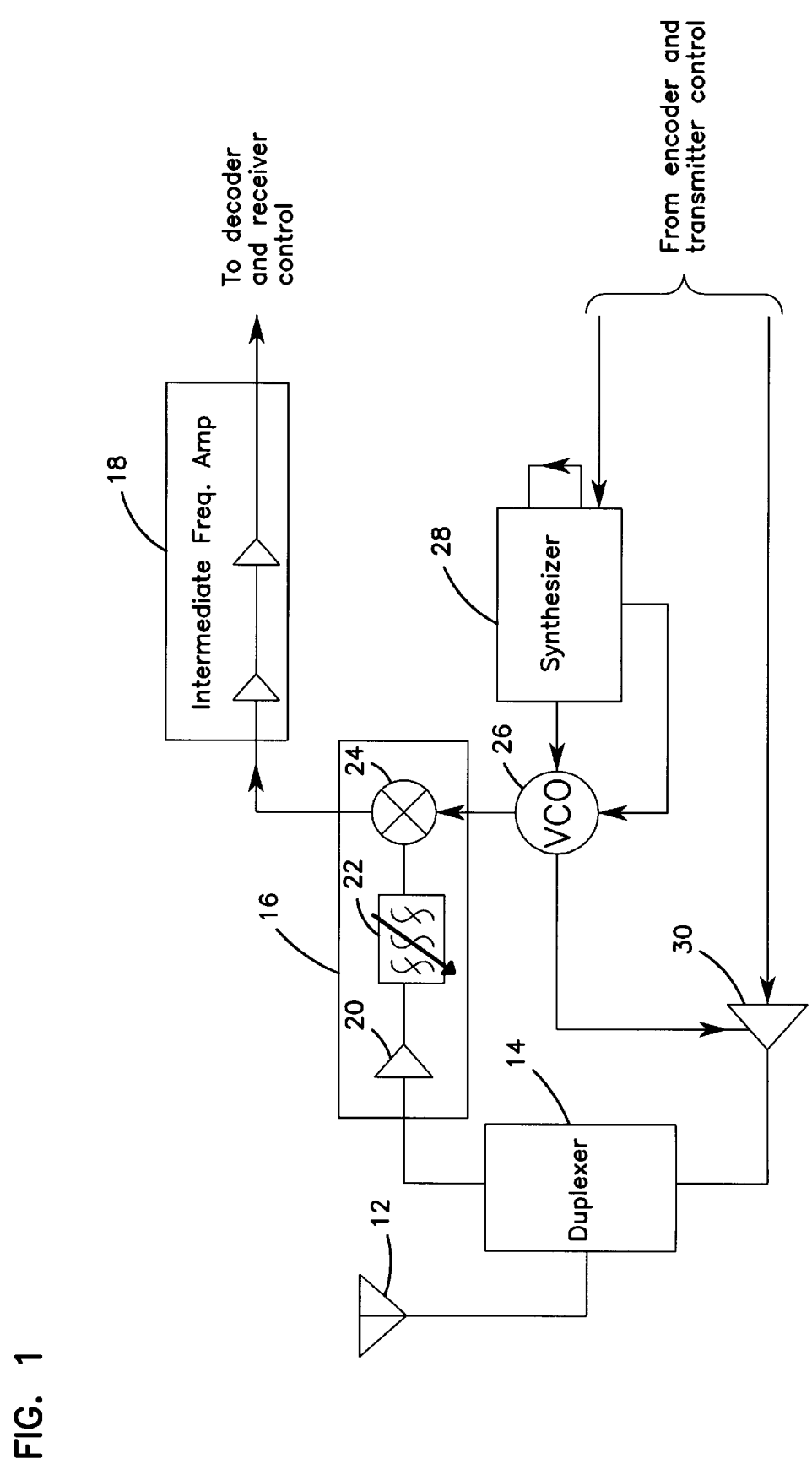
FIG. 1 is a block diagram of a circuit arrangement providing duplexed reception and transmission of radio signals in accordance with one embodiment of the present invention.

While the invention is susceptible to various modifications and alternative forms, specific embodiments thereof have been shown by way of example in the drawings and will herein be described in detail. It should be understood, however, that the detailed description is not intended to limit the invention through the particular forms disclosed. On the contrary, the intention is to cover all modifications, equivalents, and alternatives falling within the spirit and scope of the invention as defined by the appended claims.

DETAILED DESCRIPTION

The present invention is believed to be applicable to a variety of radio frequency (RF) applications in which achieving a low ripple in the passband is desirable. The present invention has been found to be particularly applicable and beneficial in cellular communication applications. While the present invention is not so limited, an appreciation of the present invention is best presented by way of a particular example application, in this instance, in the context of cellular communication.

FIG. 1 is a block diagram of an example circuit arrangement, according to one implementation and application of the present invention, providing duplexed reception and transmission of radio signals. The system of FIG. 1 includes both receive and transmit circuitry for use in various communication arrangements, such as a cellular telephone arrangement. It will be appreciated that the receive circuitry of FIG. 1 is suitable for both mobile and base portions of an example cellular telephone arrangement. Other embodiments of the invention are also suitable for use in various other systems having only receive circuitry, such as satellite receivers.

The arrangement of FIG. 1 includes an antenna 12 coupled to a duplexer 14. Receive circuitry includes a converter 16, implemented in a manner consistent with FIG. 4, coupled to receive radio signals from duplexer 14 and an intermediate frequency amplifier 18 coupled to the output of converter 16. Intermediate frequency amplifier 18 provides as output amplified signals having a predetermined frequency.

Converter 16 includes a low-noise amplifier 20 that receives input radio signals from duplexer 14. The amplified signals are provided to bandpass filter 22, and the remaining signals are input to mixer 24. Mixer 24 receives the input radio signals and signals from voltage-controlled oscillator 26, and provides signals having an intermediate frequency to amplifier 18. Voltage-controlled oscillator 26 receives signals from synthesizer 28, which, for example, includes a phase-locked loop to lock a desired frequency.

Transmit circuitry includes, in brief, an amplifier 30 that receives signals for transmission, along with signals from voltage controlled oscillator 26. The output of amplifier 30 is provided to duplexer 14. While only an amplifier is shown, it will be recognized that typical transmit circuitry conventionally includes additional mixers, amplifiers, and filters to suit a particular application.

Figure 2:
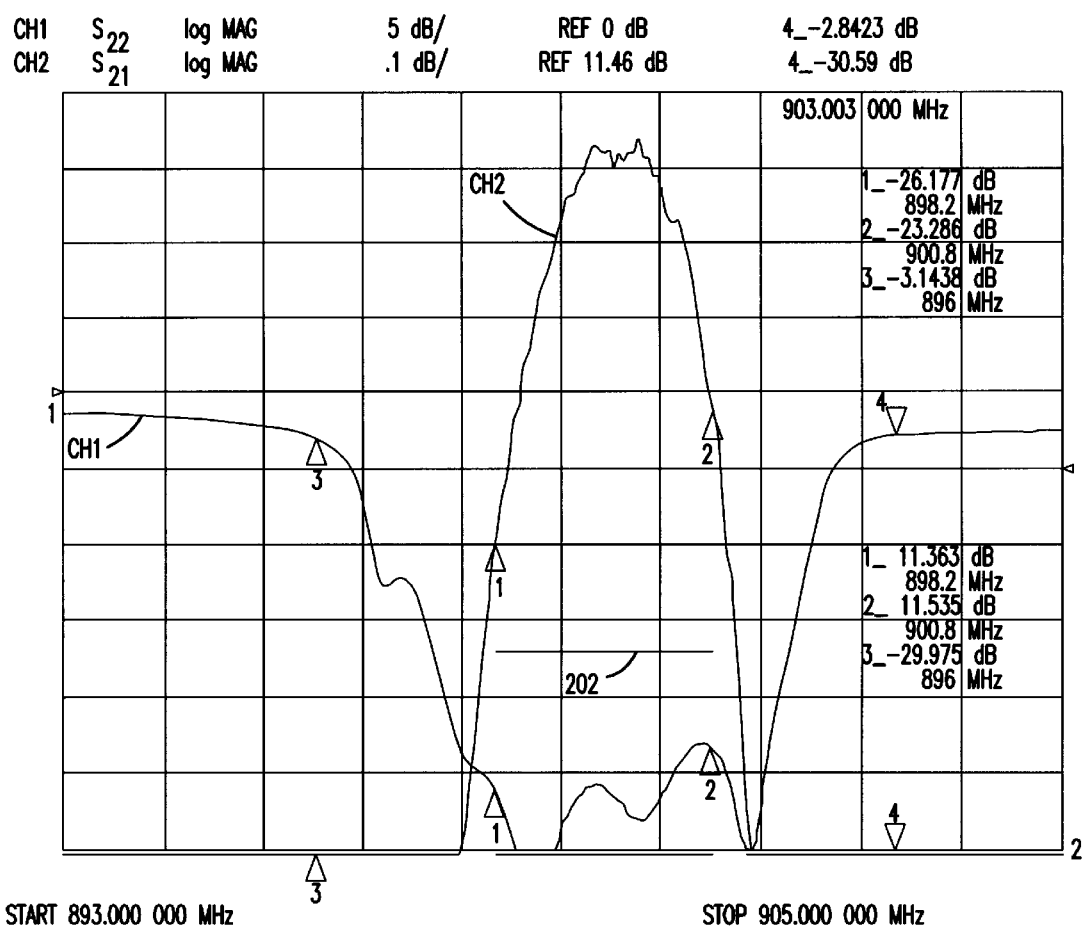
FIG. 2 is a graph that shows the ripple and output return loss of an example system that does not include a lossy network in accordance with the present invention.

FIG. 2 is a graph that shows the ripple of a filter arrangement, including an amplifier, in which the present invention is not used. The curve CH1 indicates the output return loss of an example filter arrangement, and curve CH2 shows the frequency response of the filter arrangement. The curves span a frequency range from 893 MHz to 905 MHz. For the output return loss curve, CH1, each vertical increment is 5.0 dB, beginning at 0 dB. For the frequency response curve, CH2, each vertical increment is 0.1 dB beginning at 11.46 dB.

As shown in the graph, the ripple in frequency response curve CH2 ranges from 11.363 dB at marker one, to approximately 11.8 dB at the peak of the frequency response curve, to 11.535 dB at marker 2. Thus, the ripple between marker 1 and the peak of frequency response curve CH2 is approximately equal to (11.8 dB–11.363 dB) or approximately 0.44 dB.

Line 202 illustrates an example maximum allowable output return loss within the passband of markers 1 and 2. The maximum allowable level is approximately –17.0 dB. Because the output return loss curve CH1 never rises above line 202, the example output return loss is acceptable within the passband. However, it will be recognized that the ripple, as illustrated by curve CH2, may be unacceptably high for certain applications, such as cellular communications. Where the Q factor of the filter is already high, for example, 3500, it would be very difficult and costly to replace the filter with a filter with a yet higher Q factor to reduce the ripple. Therefore, it would be desirable to reduce the ripple of curve CH2 while maintaining the output return loss below an acceptable level.

Figure 3:
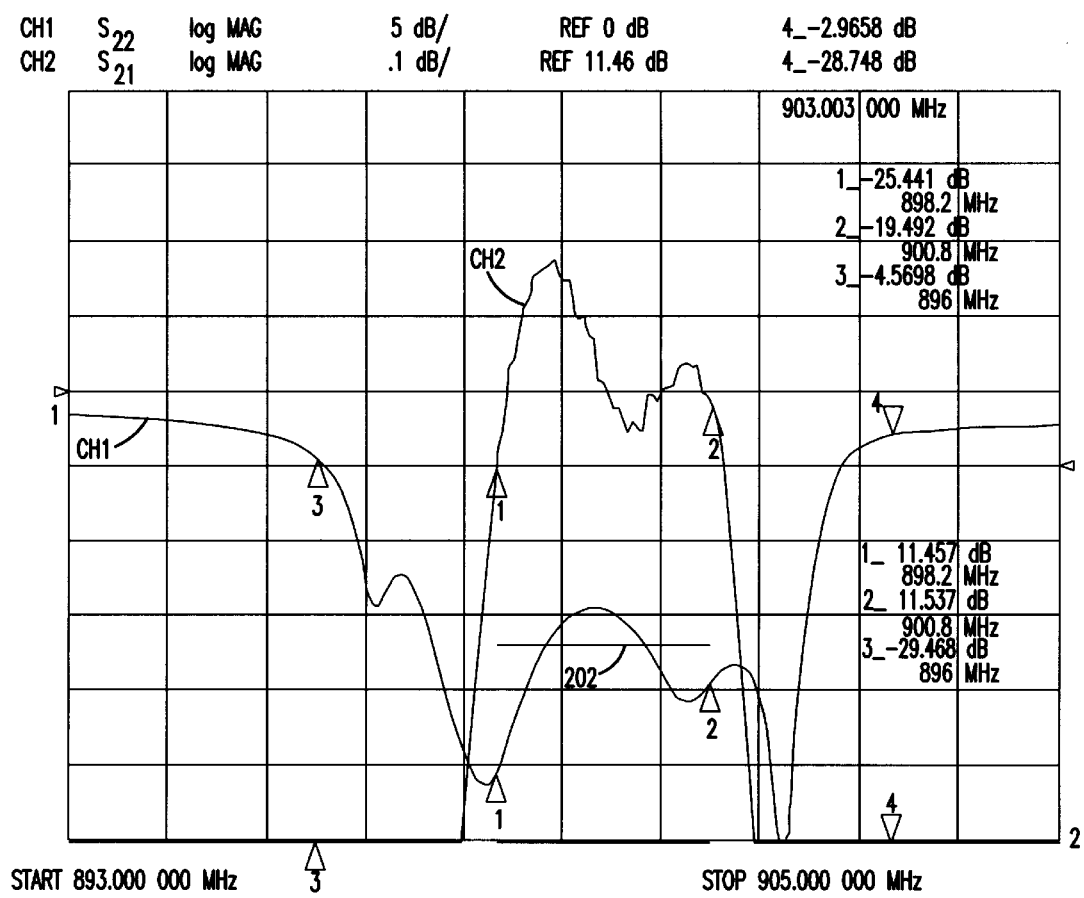
FIG. 3 is a graph that shows the ripple and output return loss of an example system without a lossy network, where the filter is tuned to reduce the ripple.

FIG. 3 is a graph that illustrates an output return loss curve and a frequency response curve for a filter arrangement where the filter has been tuned to reduce the ripple to a level in the range of 0.2 dB. The filter is tuned in a conventional manner, such as, for example, adjusting coupling-screws between resonators and other tuning screws in a filter. The tuning of the filter causes a corresponding and undesirable increase of the output return loss. At marker 1, the level of the frequency response is 11.457 dB, at the peak in the passband the level of the frequency response is approximately 11.7 dB, and at marker 2, the level of the frequency response is 11.537 dB. Therefore, by tuning the filter, the ripple is reduced to approximately the level of the frequency response at its peak in the passband less the level of the frequency response at marker 1, or 11.7 dB–11.457 dB or approximately 0.25 dB. For most applications, this level of ripple is acceptable. However, it can be seen that the output return loss now has a peak within the passband that is above the acceptable level designated at line 202. Therefore, an acceptable ripple has been achieved at the expense of an acceptable output return loss level.

Figure 4:
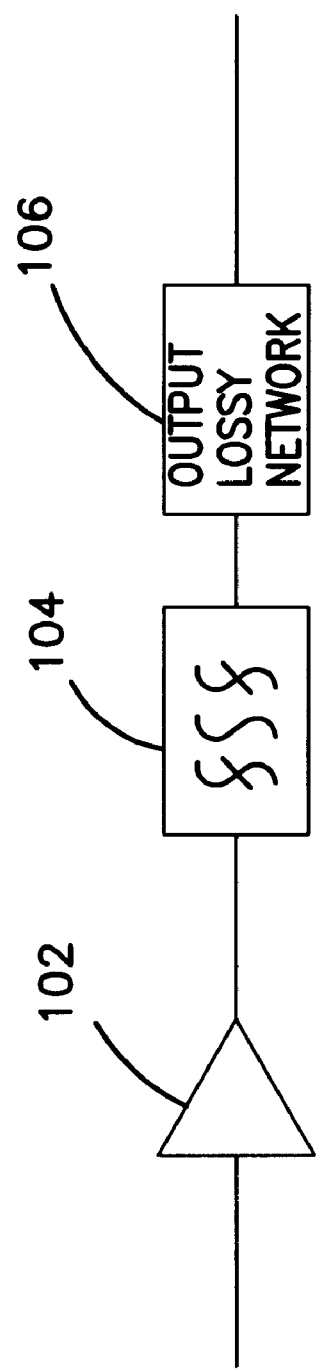
FIG. 4 is a circuit schematic of a filter arrangement according to another embodiment of the present invention.

Turning now to FIG. 4, a circuit schematic of a filter arrangement according to a first embodiment of the present invention is shown. The example filter arrangement can be used, for example, in the receive circuit illustrated in FIG. 1. Specifically, the filter arrangement includes a low-noise amplifier 102, a bandpass filter 104, and a lossy network 106 coupled to the output of bandpass filter 104. Amplifier 102 is selected according to system requirements for signal amplification, such as, for example, a low-noise amplifier. Filter 104 is a bandpass filter that is coupled to low-noise amplifier 102 in a conventional manner. An example bandpass filter 104 is the GMF 91107 filter that is commercially available from ADC SOLITRA.

A lossy network 106 is coupled to bandpass filter 104 to reduce the output return loss of the circuit arrangement. It is recognized that the output return loss is reduced by twice the insertion loss of lossy network 106. For example. If the insertion loss of lossy network 106 is 2.0 dB, then the output return loss is reduced by 4.0 dB. Lossy network 106 also reduces the frequency response of the filter arrangement, however, the frequency response reduction is approximately equal to the insertion loss.

There are many suitable implementations for lossy network 106. For example, a 50 Ohm microstrip having sufficient insertion loss could be used. A lossy material such as epoxy could be used on the microstrip. Alternatively, a high loss coaxial cable could be used to introduce the desired insertion loss. For a greater degree of control, a controllable attenuator may be used to affect the desired insertion loss. Controllable attenuators typically are available as semiconductors, coaxial cables, and microstrips (metallic traces in printed circuit boards), for example.

Figure 5:
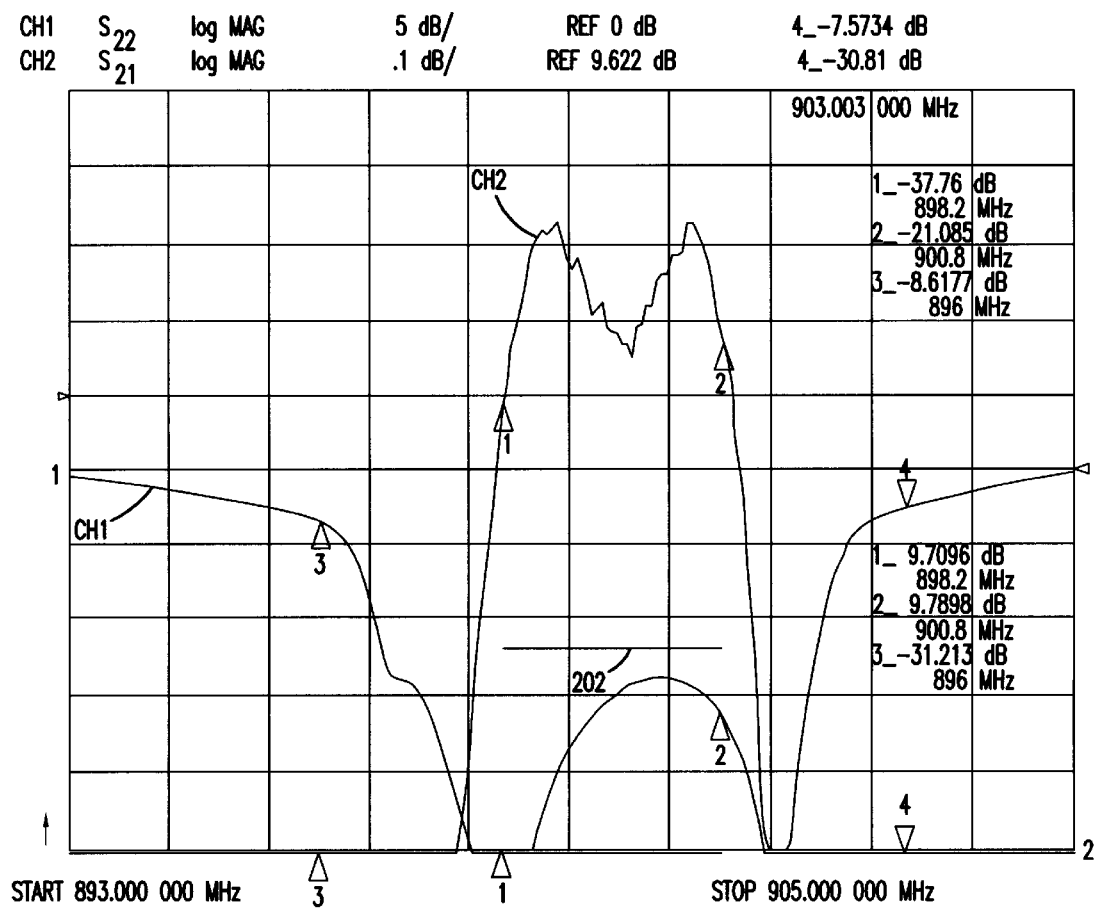
FIG. 5 is a graph that shows the ripple and output return loss of an example system that includes a lossy network coupled to the output of the bandpass filter.

FIG. 5 is a graph that shows the effect of a lossy network upon the frequency response and output return loss for a filter arrangement constructed in accordance with the present invention. The filter arrangement from which the graph of FIG. 5 was generated is essentially similar to the filter arrangement from which the graph of FIG. 3 was generated, except that the filter arrangement of FIG. 5 includes a lossy network 106. The insertion loss of the example lossy network 106 used to generate the graph of FIG. 5 is approximately 2.0 dB. It can be seen that the peak of the output return loss curve within the passband is reduced from approximately –14 dB in FIG. 3 to approximately –18 dB in FIG. 5. It can also be seen that the ripple in FIG. 5 ranges from 9.7096 dB at marker 1 to a peak of approximately 9.842 dB. Therefore, the ripple is below 0.2 dB, while the output return loss is reduced to below the acceptable limit. The overall reduction in the frequency response within the passband may be compensated for by increasing by the same amount the gain of amplifier 102. The gain of amplifier 102 is selected to provide a predetermined level of gain for the combination of the bandpass filter 104 and lossy network 106.

The invention allows usage of a bandpass filter having a Q factor between approximately 3000 and 3500 to achieve a ripple of approximately 0.2 dB. The Q factor of approximately 3000 to 3500 is such that the filter can be tuned to an acceptable ripple level, but the output return loss becomes unacceptable. Conventionally, such an arrangement results in a ripple of approximately 0.5–0.6 dB. However, many applications today, such as CDMA, require 0.5 dB over a predetermined temperature range. It will be appreciated that temperature variations affect the ripple. Therefore, it is necessary for a filter arrangement to have a ripple at some level below the requirement to account for temperature fluctuations. Thus, in accordance with the invention, by tuning the filter the ripple is reduced to approximately 0.2 dB. A lossy network having an insertion loss of approximately 2.0 dB and coupled to the filter reduces the output return loss to an acceptable level (where the return loss was raised by tuning the filter). The ripple of 0.2 dB is sufficient to allow for fluctuations in temperature and the arrangement advantageously uses a filter having a Q factor between approximately 3000 and 3500. Thus, the filter has a relatively low Q factor in terms of the acceptable ripple and output return loss.

Figure 6:
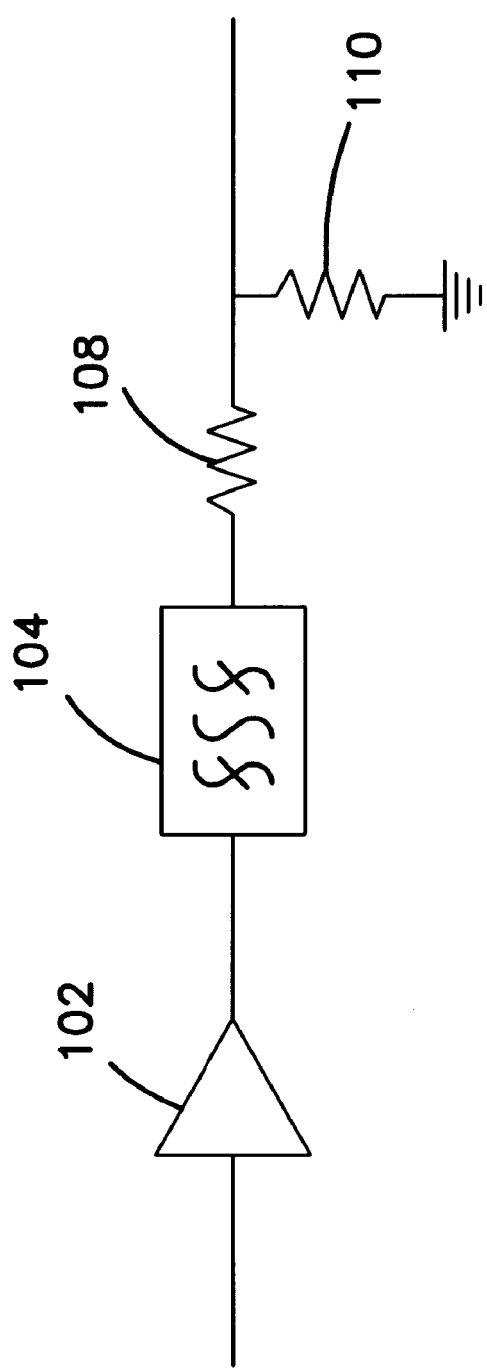
FIG. 6 is a circuit schematic of another embodiment of a filter arrangement according to the present invention.

FIG. 6 is a circuit schematic of an example filter arrangement according to another embodiment of the present invention. The gain of amplifier 102 is approximately 16.0 dB, the filter insertion loss is 4.0 dB, and the loss introduced by resistors 108 and 110 is approximately 2.0 dB. Resistor 108 is coupled in serial to the output of bandpass filter 104 and has a resistance of 6.8 Ohms. Resistor 110, having a resistance of 200 ohms, is in shunt to ground and coupled to resistor 108.

Additional resistor networks can be arranged in accordance with the present invention. For example, an alternative resistor network includes two resistors coupled in series and a third resistor coupled between them and in shunt to ground. Another embodiment includes two resistors in shunt to ground and a third resistor coupled between the two resistors. Other configurations could also be used depending upon specific design requirements.

Accordingly, the present invention provides, among other aspects, a filtering arrangement and method providing a reduction in the fluctuation of the frequency response for the passband in the bandpass filter arrangement. Other aspects and embodiments of the present invention will be apparent to those skilled in the art from consideration of this specification and practice of the invention disclosed herein. It is intended that the specification and illustrated embodiments be considered as examples only, with the true spirit and scope of the invention indicated by the following claims.

I claim:

1. A method for reducing passband ripple of a circuit arrangement including an amplifier coupled to a bandpass filter and a lossy network coupled to the bandpass filter, the filter having a Q factor that is low relative to an acceptable level of ripple, wherein tuning the filter to reduce the ripple to the acceptable level causes an unacceptable level of output return loss of the filter, comprising the steps of:

tuning the bandpass filter to produce a ripple having an acceptable level, thereby causing output return loss of the filter to rise to an unacceptable level; and reducing the output return loss to an acceptable level by providing a lossy network having sufficient insertion loss.

2. The method of claim 1, further comprising the step of providing an amplifier having sufficient gain to provide overall gain of the bandpass filter and lossy network at a predetermined level.

3. The method of claim 1, wherein the filter has a Q factor between approximately 3000 and 3500 and further comprising the steps of:

tuning the filter to reduce the ripple to approximately 0.2 dB; and providing a lossy network having an insertion loss of approximately 2.0 dB, thereby reducing the output return loss by about 4.0 dB.

4. A circuit arrangement for reducing passband ripple of a filter, comprising:

a signal amplifier;

a bandpass filter having an input coupled to the amplifier and an output, and configured and arranged with a low Q factor relative to an acceptable level of ripple and an acceptable level of output return loss, wherein tuning the filter to an acceptable level of ripple results in an unacceptable level of output return loss, wherein the filter is tuned to provide an acceptable level of ripple; and a lossy network coupled to the output of the bandpass filter and having an insertion loss sufficient to reduce the output return loss to an acceptable level.

5. The circuit arrangement of claim 4, wherein the lossy network comprises a coaxial cable.

6. The circuit arrangement of claim 4, wherein the lossy network comprises an attenuator having a controllable insertion loss.

7. The circuit arrangement of claim 4, wherein the lossy network comprises a microstrip.

8. The circuit arrangement of claim 4, wherein the lossy network comprises first and second resistors coupled to the output of the bandpass filter.

9. The circuit arrangement of claim 8, wherein the first resistor has a first terminal coupled in series to the output of the bandpass filter and a second terminal coupled to a first terminal of the second resistor, wherein a second terminal of the second resistor is coupled to ground.

10. The circuit arrangement of claim 9, wherein the first resistor has a resistance of approximately 6.8 Ohms, and the second transistor has a resistance of approximately 200 Ohms.

11. The circuit arrangement of claim 8, wherein the amplifier is a low noise amplifier.

12. The circuit arrangement of claim 4, wherein the amplifier is a low noise amplifier.

13. The circuit arrangement of claim 4, wherein the Q factor of the filter is between approximately 3000 and 3500, and the acceptable level of ripple is approximately 0.2 dB.

14. The circuit arrangement of claim 13, wherein the insertion loss of the lossy network approximately 2.0 dB.

15. A circuit arrangement for reducing passband ripple of a filter, comprising:

an antenna;

a signal amplifier coupled to the antenna;

a bandpass filter having an input coupled to the amplifier and an output, and configured and arranged with a low Q factor relative to an acceptable level of ripple and an acceptable level of output return loss, wherein tuning the filter to an acceptable level of ripple results in an unacceptable level of output return loss, wherein the filter is tuned to provide an acceptable level of ripple;

a lossy network coupled to the output of the bandpass filter and having an insertion loss sufficient to reduce the output return loss to an acceptable level;

a voltage controlled oscillator;

a mixer coupled to the lossy network and to the voltage controlled oscillator, and arranged to provide an intermediate frequency; and an intermediate frequency amplifier coupled to the mixer.

16. The circuit arrangement of claim 15, further comprising:

a duplexer coupled between the antenna and the signal amplifier; and a transmit amplifier coupled to the voltage controlled oscillator and arranged to receive transmit signals.

17. The circuit arrangement of claim 15, wherein the lossy network comprises a coaxial cable.

18. The circuit arrangement of claim 15, wherein the lossy network comprises an attenuator having a controllable insertion loss.

19. The circuit arrangement of claim 15, wherein the lossy network comprises a microstrip.

20. The circuit arrangement of claim 15, wherein the lossy network comprises first and second resistors coupled to the output of the bandpass filter.

21. The circuit arrangement of claim 20, wherein the first resistor has a first terminal coupled in series to the output of the bandpass filter and a second terminal coupled to a first terminal of the second resistor, wherein a second terminal of the second resistor is coupled to ground.

22. The circuit arrangement of claim 21, wherein the amplifier is a low noise amplifier.

23. The circuit arrangement of claim 15, wherein the amplifier is a low noise amplifier.

24. The circuit arrangement of claim 15, wherein the Q factor of the filter is between approximately 3000 and 3500, and the acceptable level of ripple is approximately 0.2 dB.

25. The circuit arrangement of claim 24, wherein the insertion loss of the lossy network is approximately 2.0 dB.

* * * * *